(12) United States Patent
Li et al.

(10) Patent No.: US 7,675,753 B2
(45) Date of Patent: Mar. 9, 2010

(54) MOUNTING APPARATUS FOR HEAT SINK

(75) Inventors: Yang Li, Shenzhen (CN); Yu-Hsu Lin, San Jose, CA (US); Jeng-Da Wu, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/180,215

(22) Filed: Jul. 25, 2008

(65) Prior Publication Data
US 2009/0185351 A1 Jul. 23, 2009

(30) Foreign Application Priority Data
Jan. 21, 2008 (CN) .................. 2008 2 0300117

(51) Int. Cl.
H05K 7/20 (2006.01)
F28F 7/00 (2006.01)
H01L 23/34 (2006.01)

(52) U.S. Cl. .................. 361/719; 165/185; 257/719; 361/704

(58) Field of Classification Search .................. 257/719; 361/719
See application file for complete search history.

(56) References Cited

U.S. PATENT DOCUMENTS

| 6,061,239 | A | 5/2000 | Blomquist | |
| 6,307,748 | B1* | 10/2001 | Lin et al. | 361/704 |
| 6,752,577 | B2* | 6/2004 | Chen et al. | 411/508 |
| 6,795,317 | B1* | 9/2004 | Liu | 361/704 |
| 7,116,556 | B2* | 10/2006 | Lee et al. | 361/704 |
| 7,126,823 | B2* | 10/2006 | Chen et al. | 361/702 |
| 7,180,743 | B2* | 2/2007 | Chen et al. | 361/704 |
| 7,295,439 | B2* | 11/2007 | Zhong et al. | 361/710 |
| 7,405,939 | B2* | 7/2008 | Yang | 361/719 |
| 7,475,532 | B2* | 1/2009 | Corsmeier | 60/226.3 |
| 2005/0083661 | A1* | 4/2005 | Lee et al. | 361/719 |
| 2007/0178226 | A1* | 8/2007 | Baertele | 427/78 |
| 2008/0037225 | A1* | 2/2008 | Yang | 361/719 |
| 2008/0192440 | A1* | 8/2008 | Meng et al. | 361/719 |

* cited by examiner

Primary Examiner—Gregory D Thompson
(74) Attorney, Agent, or Firm—D. Austin Bonderer

(57) ABSTRACT

A mounting apparatus for mounting a heat sink on a board, includes a first locking hole defined in the heat sink, a second locking hole defined in the board, and a locking member. The locking member includes a base and a rod. The base defines a hole. A bottom of the base forms a pair of separated elastic claws around the hole. The elastic claws are inserted through the first and second locking holes. The rod includes an expanded portion. The rod slides in the hole of the base with the expanded portion located inbetween the claws to expand the claws outwards to be larger than the second locking hole to lock the locking member on the board and to mount the heat sink on the board.

17 Claims, 6 Drawing Sheets

MOUNTING APPARATUS FOR HEAT SINK

BACKGROUND

1. Technical Field

The present invention relates to a mounting apparatus for mounting a heat sink.

2. Description of Related Art

The amount of heat generated from electronic components of computers has risen dramatically. A heat sink is usually mounted on an electronic component to conduct heat away from the component.

Heat sinks are typically mounted on electronic components and held in place using screws. However, it is tedious and time-consuming to use screws. Another mounting device is clip. For example, U.S. Pat. No. 6,061,239, titled "Cam-type retainer clip for heat sinks for electronic integrated circuits," discloses a heat sink assembly comprising a heat sink and a retainer clip configured to attach to an electronic package or semiconductor device to dissipate heat from such device. The heat sink includes a flat base with a plurality of upwardly extending fins. The fins define at least one channel. The retainer clip includes two parts. The first part is an elongated, resilient, metal strap that has a holding means at each end for engaging a semiconductor socket, or a semiconductor module, to secure the retainer clip and the heat sink to the device or module. The second part is a cam-type latch, which is pivotally positioned in the middle of the elongated strap and includes an arm and a cam. The cam has a bearing surface, which is spaced from the axis of the elongated member a distance greater than the distance between the elongated member and the upper surface of the heat sink base when in the initially assembled position. When the arm is rotated, the bearing surface of the cam is forced against the upper surface of the heat sink, which causes the strap to be displaced upwardly placing pressure on the strap and thereby forcing the heat sink into heat conducting engagement with the electronic device or module. However, a large force is needed to bend the retainer clip, which is inconvenient.

Therefore, a mounting apparatus that conveniently mounts a heat sink on an electronic component is desired to overcome the above-described deficiencies.

DETAILED DESCRIPTION OF THE EMBODIMENTS

Figure 1:
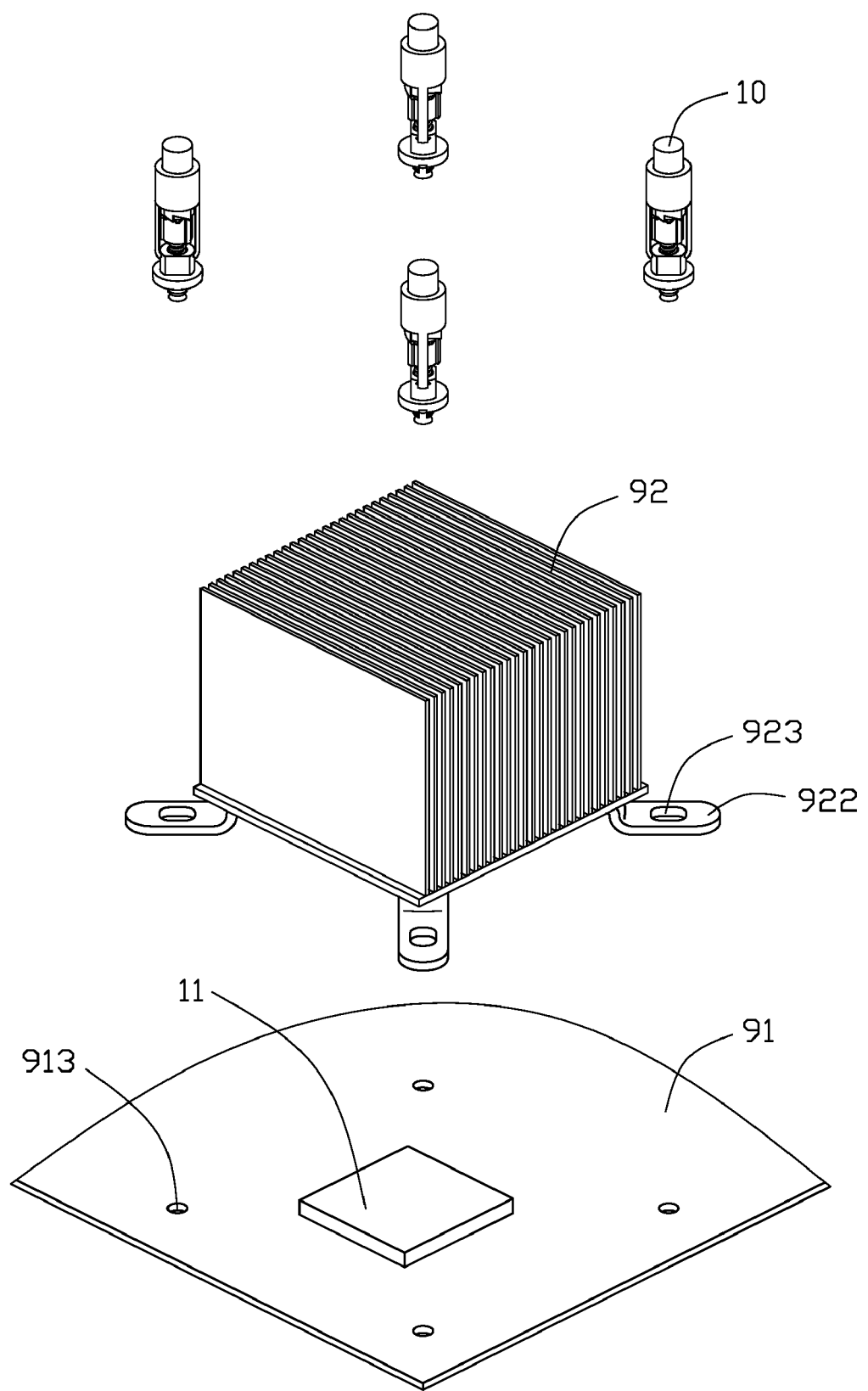
FIG. 1 is an exploded, isometric view of an embodiment of a mounting apparatus for a heat sink, the mounting apparatus including a locking member comprising a base.

Referring to FIG. 1, a mounting apparatus for mounting a heat sink 92 to a heat generating component 11 mounted on a board 91 includes a plurality of locking members 10. The heat sink 92 includes four support legs 922. Each support leg 922 defines a first locking hole 923. The board 91 defines four second locking holes 913 near four corners of the heat generating component 11 corresponding to the first locking holes 923 of the heat sink 92.

Figure 2:
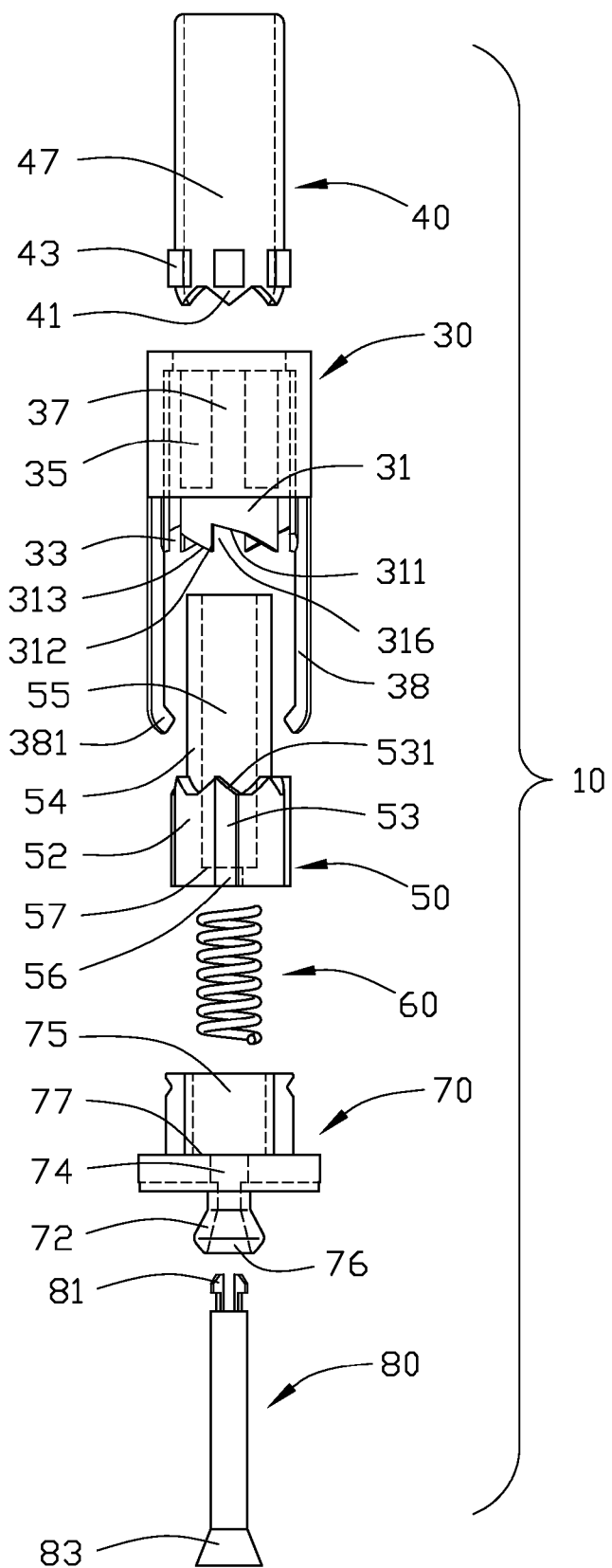
FIG. 2 is an exploded, front elevation view of the locking member of FIG. 1.

Referring to FIG. 2, each locking member 10 includes a sleeve 30, a driving post 40, a sliding member 50, a spring 60, a base 70, and a rod 80.

The sleeve 30 is hollow, and forms six blocks 35 on an inner surface. The six blocks 35 are evenly spaced from each other. The spaces between the blocks 35 are slideways 37. Three conducting pieces 31 protrude down from a bottom edge of the sleeve 30. A positioning slot 33 is defined between every two adjacent conducting pieces 31. The three positioning slots 33 are aligned with three of the spaced slideways 37. Each conducting piece 31 defines a positioning cutout 316. A first conducting slope 311 is formed on a first side of the positioning cutout 316, and a second conducting slope 313 is formed on a second side of the positioning cutout 316. An upper end of the first conducting slope 311 communicates with the cutout 316, and a lower end of the first conducting slope 311 communicates with one of the three positioning slots 33. An upper end of the second conducting slope 313 communicates with another one of the three positioning slots 33, and a lower end of the second conducting slope 313 communicates with the cutout 316. An upright stopping surface 312 is connected between the upper end of the first conducting slope 311 and the lower end of the second conducting slope 313. A pair of arms 38 extends from the sleeve 30. Each arm 38 forms a clasp 381 at a free end. The clasps 381 are located below the conducting pieces 31.

The driving post 40 is capable of moving up and down in the sleeve 30. The driving post 40 is hollow, and defines a central hole 47. Six sliding blocks 43 are evenly spaced from each other and formed on an outer surface of the driving post 40 corresponding to the six slideways 37 of the sleeve 30. A plurality of teeth 41 is formed on a bottom edge of the driving post 40.

The sliding member 50 is hollow, and defines a large hole 55 at an upper portion, and a small hole 56 at a lower portion. A step surface 57 is formed on a connecting portion of the large hole 55 and the small hole 56. The sliding member 50 comprises an upper thin portion 54 and a lower thick portion 52. Three rib pieces 53 are evenly spaced from each other and formed on an outer surface of the lower thick portion 52 corresponding to the three conducting pieces 31. An upper edge of each of the rib pieces 53 defines an engaging slope 531 configured for engaging with the first and second conducting slopes 311, 312.

Figure 3:
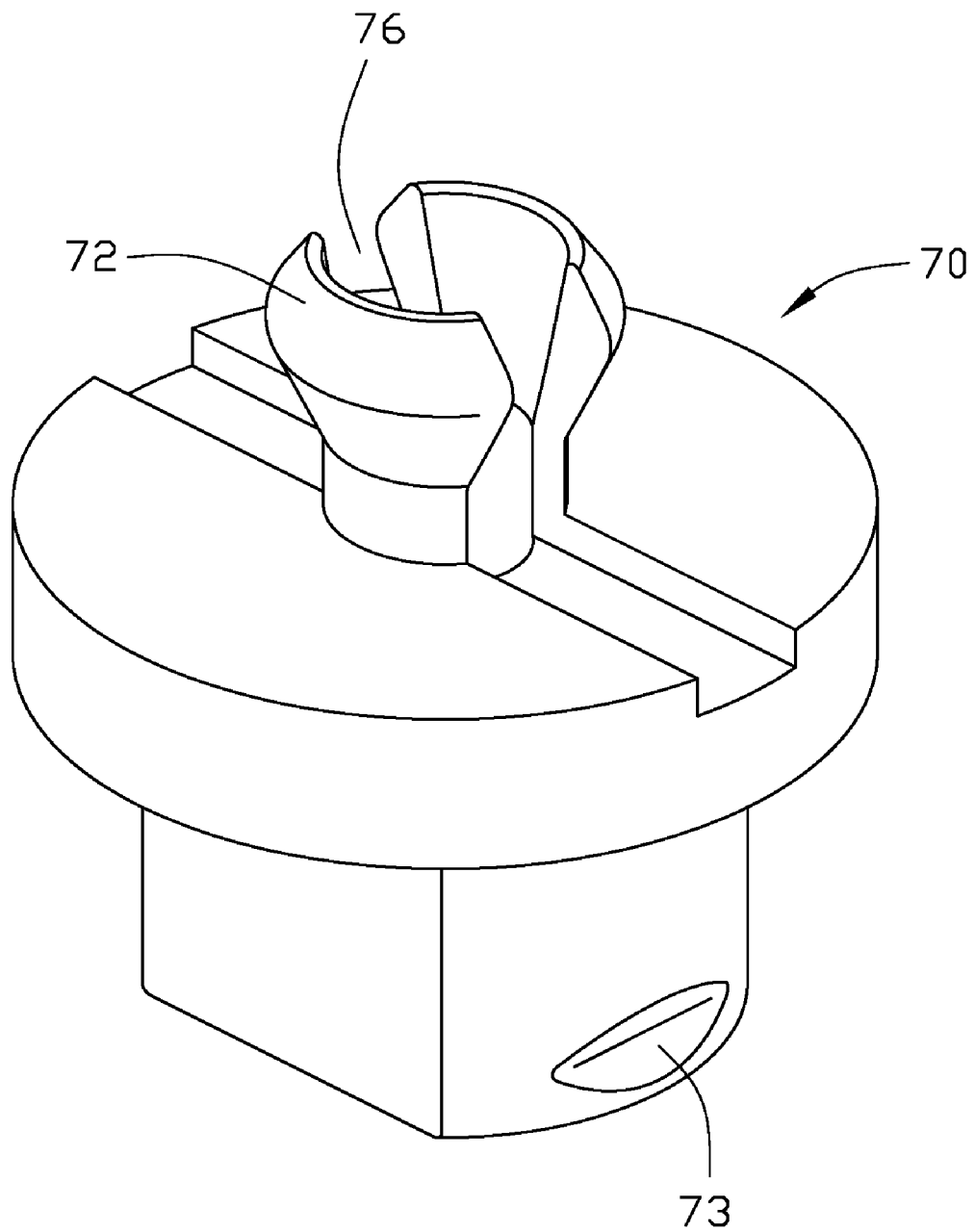
FIG. 3 is an isometric view of the base of FIG. 2.

Referring also to FIG. 3, the base 70 is hollow, and defines a large hole 75 at an upper portion, and a small hole 74 at a lower portion. A step surface 77 is formed on a connecting portion of the large hole 75 and the small hole 74. A pair of recesses 73 is defined on the base corresponding to the clasps 381. Two spaced elastic claws 72 extend from a bottom of the base 70 around the small hole 74. The elastic claws 72 face each other and cooperatively define a through hole 76. The through hole 76 communicates with the small hole 74.

Two hooks 81 extend upwards from a top portion of the rod 80. A bottom portion of the rod 80 expands to form a truncated cone shape expanded portion 83.

Figure 4:
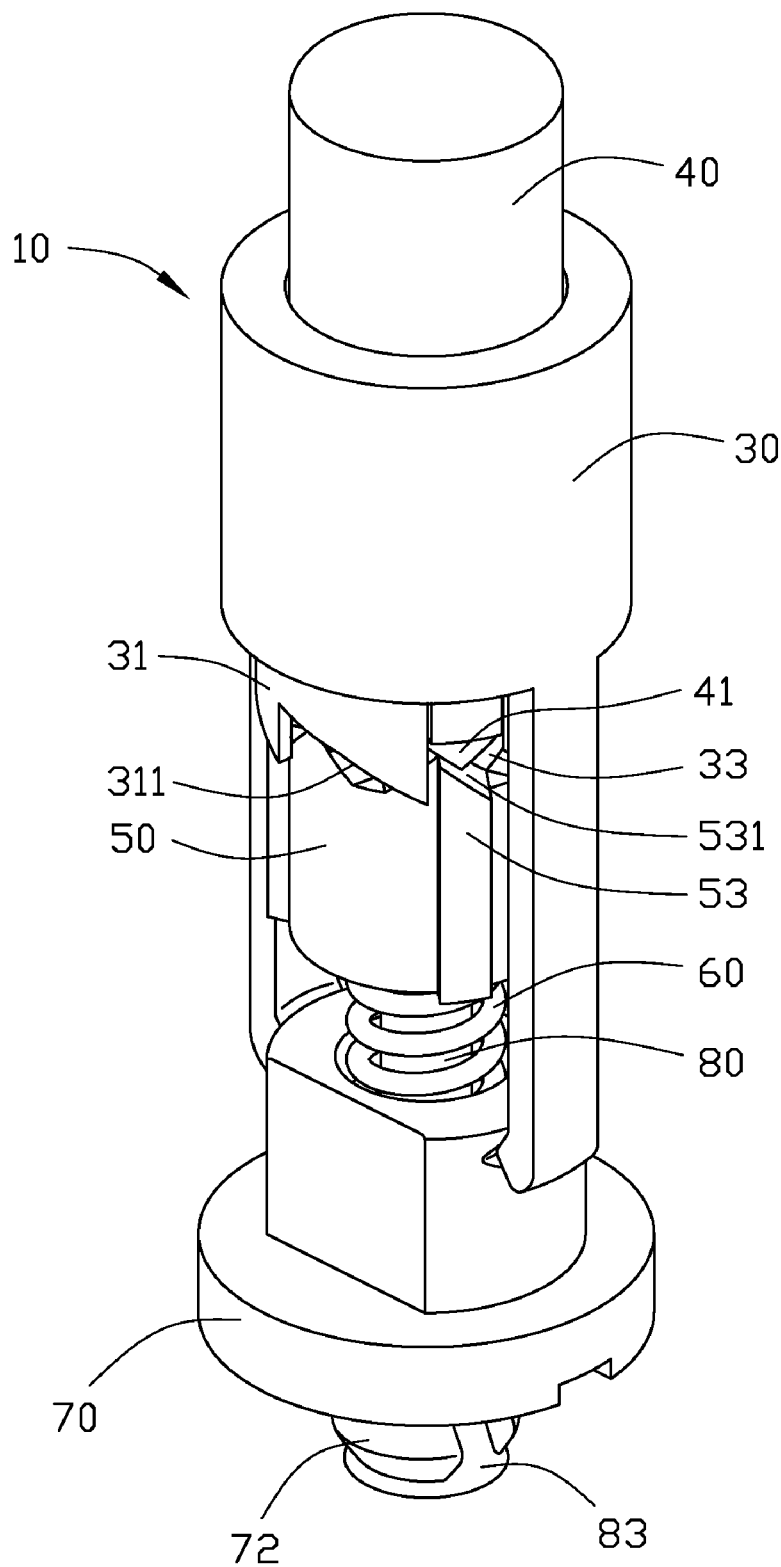
FIG. 4 is an assembled, isometric view of the locking member of FIG. 2.

Referring to FIG. 4, the locking member 10 is assembled by inserting the driving post 40 into the sleeve 30. The sliding blocks 43 slide into the slideways 37 and configured for sliding up and down in the sleeve 30.

The top portion of the rod 80 is inserted through the through hole 76, the small hole 74, and the large hole 75. The expanded portion 83 of the rod 80 is capable of sliding inbetween the claws 72 and resisted by an inner surface of the claws 72. The spring 60 is positioned around the rod 80, and received in the large hole 75. A bottom end of the spring 60 contacts the step surface 77. The hooks 81 insert into the small hole 56 and are resiliently deformed by sides of the small hole 56. Once inserted, the hooks 81 rebound to clamp on the step surface 57, thereby assembling the sliding member 50, the spring 60, the base 70, and the rod 80 together. A top end of the spring 60 resists against a bottom surface of the sliding member 50.

The driving post 40 is inserted through the sleeve 30. The sliding member 50 is inserted into the sleeve 30 with the rib pieces 53 sliding into the positioning slots 33. The engaging slopes 531 of the rib pieces 53 resist against the teeth 41. The clasps 381 engage in the recesses 73 of the base 70 to secure the sleeve 30 onto the base 70, thereby, completing the assembly of the locking member 10.

Figure 5:
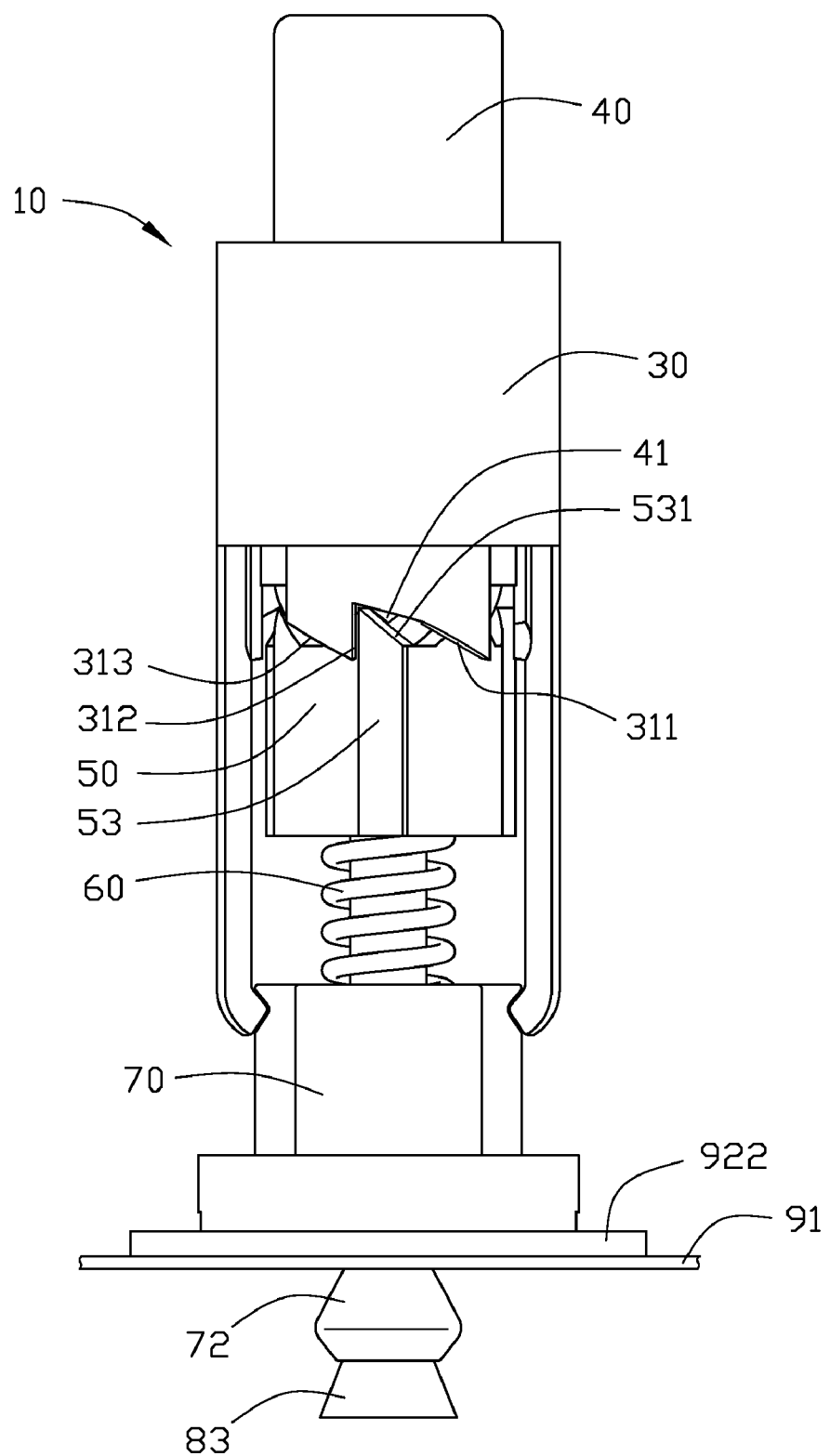
FIG. 5 is an assembled view of the locking member of FIG. 2 when the locking member is unlocked.

FIG. 5 shows the assembled locking member 10 in an unlocked state. In the unlocked state, the rib pieces 53 are received in the positioning cutouts 316 of the sleeve 30, and the expanded portion 83 of the rod 80 is located out of the claws 72. In this state, a size of the claws 72 is smaller than a size of the second locking hole 913 so that the heat sink 92 and the locking member 10 can be removed from the board 91.

Figure 6:
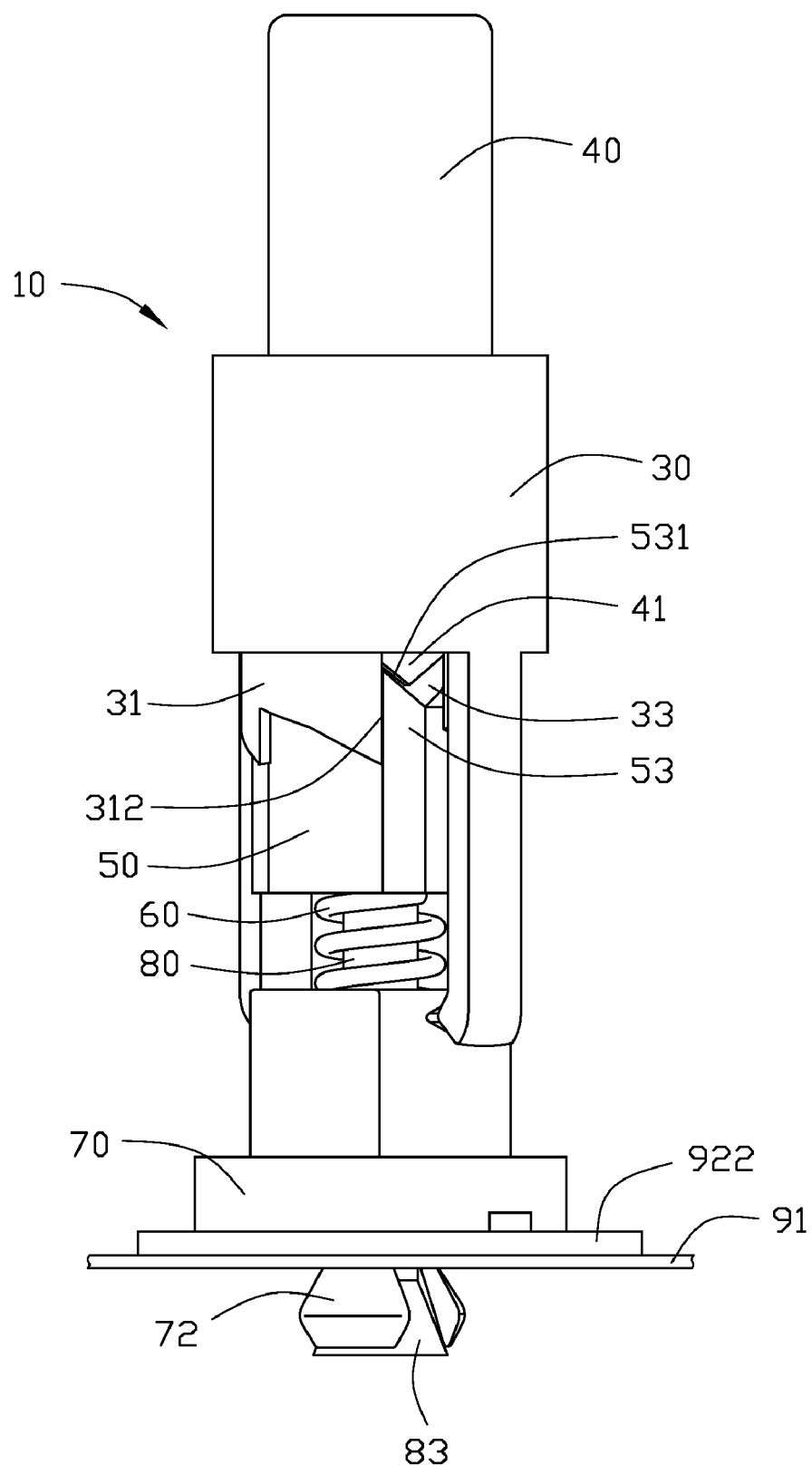
FIG. 6 is an assembled view the locking member of FIG. 2, viewed from another aspect when the locking member is locked.

FIG. 6 shows the assembled locking member 10 in a locked state. In the locked state, the rib pieces 53 are received in the positioning slots 33 and the expanded portion 83 is wedged inbetween the claws 72, thereby forcing the claws 72 to expand outwards and resist against the second locking hole 913 to mount the heat sink 92 to the heat generating component 11.

To change the locking member 10 from the locked state to the unlocked state, the driving post 40 is pressed down. The teeth 41 pushes against the engaging slope 531, forcing the sliding member 50 down and compressing the spring 60. As the teeth 41 is pushed against the engaging slope 531, the rib piece 53 slides out of the positioning slot 33. As the driving post 40 is released, the sliding member 50 rotates because the engaging slope 531 is sloped and the elastic force of the spring 60 pushes the engaging slope 531 to slide along the first conducting slope 311 until the rib piece 53 rests against the upright stopping surface 312.

To change the locking member 10 from the unlocked state to the locked state, the driving post 40 is pressed down. The teeth 41 pushes against the engaging slope 531, forcing the sliding member 50 to slide down along the stopping surface 312 and compressing the spring 60. As the driving post 40 is released, the elastic force of the spring 60 pushes the engaging slope 531 to slide along the second conducting slope 313 of the sleeve 30 until the rib piece 53 slides into the positioning slot 33.

The heat sink 92 is mounted to the board 91 by placing the four supporting legs 922 on a top surface of the board 91. The first locking holes 923 of the support legs 922 are aligned with the second locking holes 913 of the board 91. The locking members 10, which are in the unlocked state, are inserted in the first locking holes 923 and the second locking holes 913. The expanded portion 83 and the claws 72 are inserted through the first locking hole 923 and the second locking hole 913. The bottom of the base 70 is positioned over the support leg 922. The driving post 40 is pressed to switch the locking member 10 to the locked state, and the elastic force of the spring forces the expanded portion 83 inbetween the claws 72, thereby expanding the claws 72 outwards to be larger than the second locking hole 913. The locking member 10 is locked on the board 91 securing the heat sink 92 to the board 91.

If the heat sink 92 needs to be detached from the board 91, the driving post 40 is pressed to switch the locking member 10 to the unlocked state. The expanded portion 83 of the rod 80 is forced out of the claws 72 and the claws 72 collapse to an original state which is smaller than the second locking hole 913. The claws 72 and the expanded portion 83 are drawn out from the second locking hole 913 and the first locking hole 923 and the heat sink 92 can be detached from the board 91.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mounting apparatus for mounting a heat sink to a board, the mounting apparatus comprising:
   a first locking hole defined in the heat sink;
   a second locking hole defined in the board such that the second locking hole aligns with the first locking hole;
   a locking member comprising:
      a base, the base defining a hole, the base comprising two spaced elastic claws formed on a bottom surface and around the hole, the base being located on one side of the board with the elastic claws inserted through the first and second locking holes; and
      a rod comprising an expanded portion configured to slide in the hole and expand the elastic claws outwards to be larger than the second locking hole thereby locking the locking member to the board and securing the heat sink to the board;
   wherein the locking member further comprises a hollow sleeve and a sliding member, wherein the rod is mounted in the sliding member, the base is mounted below the sleeve, and the sleeve defines a positioning slot and comprises a conducting piece which defines a positioning cutout; the sliding member comprises a rib piece configured to slide along the conducting piece between the positioning slot and the positioning cutout; when the expanded portion is located among the claws, the rib piece slides in the positioning slot; when the expanded portion is located out of the claws, the rib piece slides in the positioning cutout.

2. The mounting apparatus of claim 1, wherein the locking member further comprises a driving post, the driving post slides in a top portion of the sleeve; the sliding member slides in a lower portion of the sleeve; the expanded portion is located out of the claws by pressing the driving post to push the sliding member.

3. The mounting apparatus of claim 2, wherein a top edge of the rib piece defines an engaging slope; the driving post comprises a plurality of teeth formed on a bottom edge of the driving post, the teeth configured for pushing against the engaging slope causing the sliding member to slide down and rotate.

4. The mounting apparatus of claim 3, wherein the conducting piece forms a first conducting slope on a first side of the cutout, and a second conducting slope on a second side of the cutout; an upper end of the first conducting slope communicates with the positioning cutout; a lower end of the first conducting slope communicates with the positioning slot; an upper end of the second conducting slope communicates with the positioning slot; and a lower end of the second conducting slope communicates with the cutout; the locking member further comprises a spring sandwiched between the base and the sliding member configured for driving the engaging slope to slide along the first and second conducting slopes.

5. The mounting apparatus of claim 4, wherein an upright stopping surface of the conducting piece is connected between the upper end of the first conducting slope and the lower end of the second conducting slope configured for resisting the rib piece to locate it in the positioning cutout.

6. The mounting apparatus of claim 1, wherein a pair of arms extends from the sleeve, each arm forms a clasp at a free end; the base defines a pair of recesses configured for engaging with the clasps to mount the base on the sleeve.

7. The mounting apparatus of claim 1, wherein the sliding member defines a small hole and a large hole communicating with the small hole, and forms a step surface at a connecting portion of the small hole and the large hole; the rod forms a pair of hooks configured for being inserted through the small hole and engaging with the step surface.

8. The mounting apparatus of claim 1, wherein the expanded portion is truncated cone shaped.

9. A mounting apparatus for mounting a heat sink on a board, the mounting apparatus comprising:
a first locking hole defined in the heat sink;
a second locking hole defined in the board such that the second locking hole aligns with the first locking hole;
a locking member comprising:
a base comprising a plurality of elastic claws formed on a bottom surface, the bottom surface of the base being located on one side of the board with the elastic claws inserted through the first and second locking; and
a rod comprising an expanded portion configured to expand the elastic claws outwards to be larger than the second locking hole in a locking position and configured to be positioned out of the claws to fold the claws to be smaller than the second locking hole in an unlocking position;
wherein the locking member further comprises a hollow sleeve and a sliding member, wherein the rod is mounted in the sliding member, the base is mounted below the sleeve, and the sleeve defines a positioning slot and comprises a conducting piece which defines a positioning cutout; the sliding member comprises a rib piece configured to slide along the conducting piece between the positioning slot and the positioning cutout; when the expanded portion is located among the claws in the locked position, the rib piece slides in the positioning slot; when the expanded portion is located out of the claws, the rib piece slides in the positioning cutout in the unlocked position.

10. The mounting apparatus of claim 9, wherein the base defines a hole; the plurality of claws is formed around the hole.

11. The mounting apparatus of claim 10, wherein the locking member further comprises driving post the driving post slides in a top portion of the sleeve; the sliding member slides in a bottom portion of the sleeve; the expansion portion is located out of the claws in the unlocked position by pressing the driving post to push the sliding member.

12. The mounting apparatus of claim 11, wherein a top edge of the rib piece defines an engaging slope; the driving post comprises a plurality of teeth formed on a bottom edge of the driving post, the teeth configured for pushing against the engaging slope causing the sliding member to slide down and rotate.

13. The mounting apparatus of claim 12, wherein the conducting piece forms a first conducting slope on a first side of the cutout, and a second conducting slope on a second side of the cutout; an upper end of the first conducting slope communicates with the positioning cutout; a lower end of the first conducting slope communicates with the positioning slot; an upper end of the second conducting slope communicates with the positioning slot; and a lower end of the second conducting slope communicates with the cutout; the locking member further comprises a spring sandwiched between the base and the sliding member configured for driving the engaging slope to slide along the first and second conducting slopes.

14. The mounting apparatus of claim 13, wherein an upright stopping surface of the conducting piece is connected between the upper end of the first conducting slope and the lower end of the second conducting slope configured for resisting the rib piece to locate it in the positioning cutout.

15. The mounting apparatus of claim 10, wherein a pair of arms extends from the sleeve, each arm forms a clasp at a free end; the base defines a pair of recesses configured for engaging with the clasps to mount the base on the sleeve.

16. The mounting apparatus of claim 10, wherein the sliding member defines a small hole and a large hole communicating with the small hole, and forms a step surface at a connecting portion of the small hole and the large hole; the rod forms a pair of hooks configured for being inserted through the small hole and engaging with the step surface.

17. The mounting apparatus of claim 9, wherein the expanded portion is truncated cone shaped.

* * * * *